(12) United States Patent
Parekh et al.

(10) Patent No.: US 7,189,662 B2
(45) Date of Patent: Mar. 13, 2007

(54) METHODS OF FORMING SEMICONDUCTOR CONSTRUCTIONS

(75) Inventors: Kunal R. Parekh, Boise, ID (US); Chandra V. Mouli, Boise, ID (US); M. Ceredig Roberts, Boise, ID (US); Fernando Gonzalez, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 10/925,793

(22) Filed: Aug. 24, 2004

(65) Prior Publication Data

US 2006/0046355 A1 Mar. 2, 2006

(51) Int. Cl.
*H01L 21/31* (2006.01)

(52) U.S. Cl. .................. 438/778; 438/424; 438/437; 438/787; 257/E21.193; 257/E21.212

(58) Field of Classification Search ............... 438/778, 438/787, 424, 429, 437
See application file for complete search history.

(56) References Cited

U.S. PATENT DOCUMENTS

| 5,285,096 | A | * | 2/1994 | Ando et al. .................. 257/379 |
| 6,023,093 | A | * | 2/2000 | Gregor et al. .............. 257/632 |
| 7,022,560 | B2 | * | 4/2006 | Olofsson ..................... 438/163 |
| 2002/0132493 | A1 | * | 9/2002 | Watt et al. ................... 438/773 |
| 2004/0058557 | A1 | * | 3/2004 | Eisele et al. ................. 438/769 |
| 2005/0170608 | A1 | * | 8/2005 | Kiyotoshi et al. ........... 438/427 |
| 2006/0003595 | A1 | * | 1/2006 | Passlack et al. ............. 438/758 |

* cited by examiner

*Primary Examiner*—Fernando L. Toledo
(74) *Attorney, Agent, or Firm*—Wells St. John P.S.

(57) ABSTRACT

The invention includes methods of forming and/or passivating semiconductor constructions. In particular aspects, various oxides of a semiconductor substrate can be formed by exposing semiconductive material of the substrate to deuterium-enriched steam. In other aspects, a semiconductor construction is passivated by subjecting the construction to an anneal at a temperature of greater than or equal to 350° C. while exposing the construction to a deuterium-enriched ambient.

49 Claims, 8 Drawing Sheets

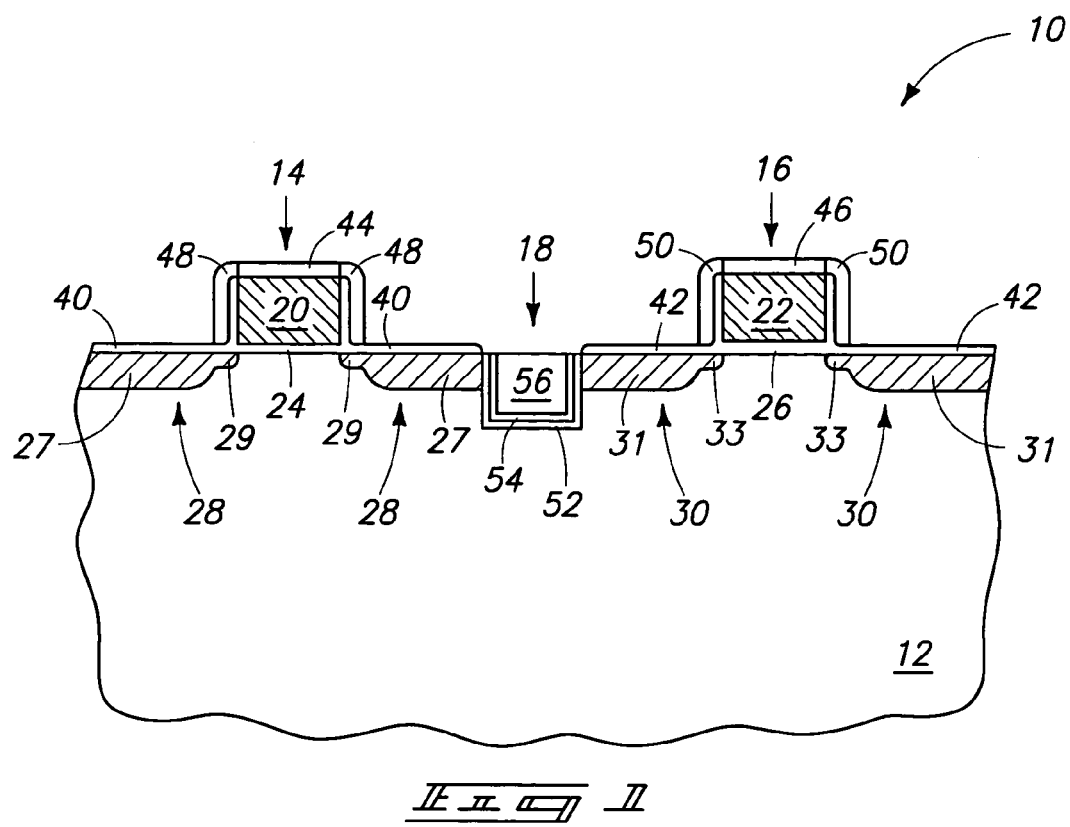
_Fig. 1_
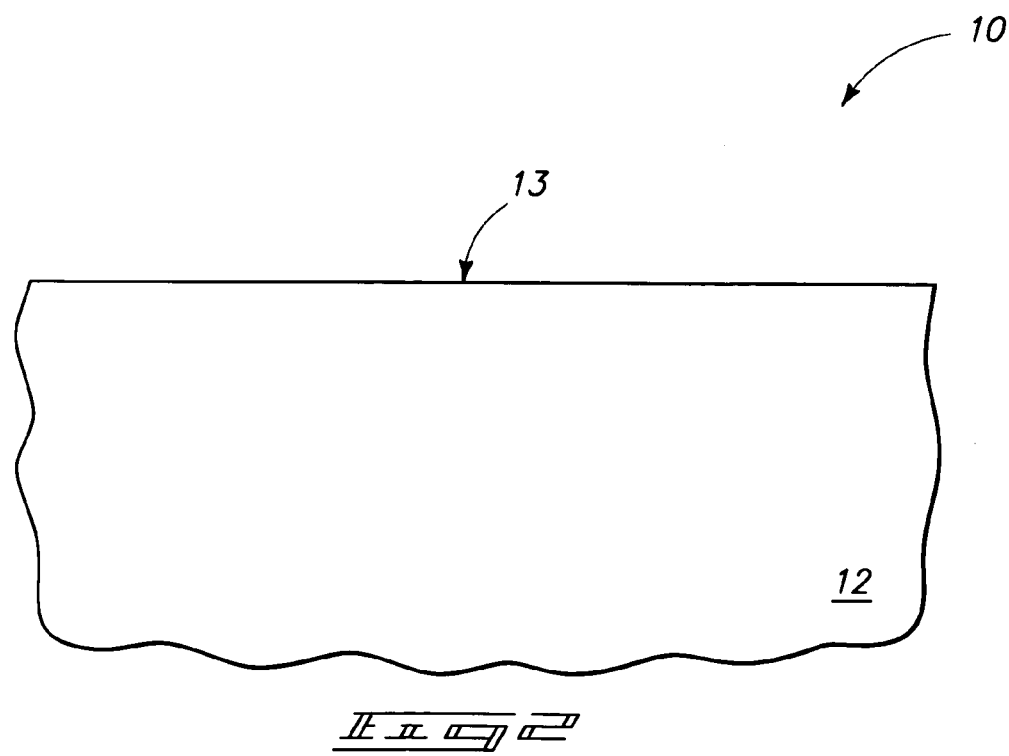
_Fig. 2_

METHODS OF FORMING SEMICONDUCTOR CONSTRUCTIONS

TECHNICAL FIELD

The invention pertains to methods of forming semiconductor constructions, and in particular aspects pertains to methods which include formation of semiconductor constructions and passivation of the constructions.

BACKGROUND OF THE INVENTION

Semiconductor constructions can comprise numerous electrically insulative structures, including, for example, gate dielectric, capacitor dielectric, isolation regions, etc. Frequently, at least some of the insulative structures will have some hydrogen incorporated therein.

The hydrogen traditionally utilized is the naturally-occurring isotopic mixture, which is about 99.985% $^1$H, and about 0.015% $^2$H (deuterium).

A continuing goal in semiconductor processing is to produce robust devices in higher levels of integration. In some aspects, the invention described and claimed in this disclosure extends deuterium-enrichment technologies to improve stability of various insulative materials, and to improve longevity of devices comprising such insulative materials.

SUMMARY OF THE INVENTION

In one aspect, the invention encompasses a method of forming a semiconductor construction which includes two or more of the following five steps in any order relative to one another: (1) at least a portion of a first gate oxide is formed by exposure of a semiconductor material to deuterium-enriched steam; (2) at least a portion of a second gate oxide is formed by exposure of a semiconductor material to deuterium-enriched steam; (3) at least a portion of an oxide is formed over a defined location of a conductively-doped region of a semiconductor material by exposure of the semiconductor material to deuterium-enriched steam; (4) at least a portion of an isolation region is formed by exposure of a semiconductive material to deuterium-enriched steam; and (5) a semiconductor assembly is subjected to an anneal at a temperature of greater than or equal to about 350° C. while exposing the assembly to a deuterium-enriched ambient (the ambient can comprise deuterium-enriched molecular hydrogen in combination with a carrier, such as nitrogen). The five step process can include multi-gate processes, or can include methods in which only a single gate is formed. Also, the process can include aspects for using deuterium-enriched steam during re-oxidation following gate patterning and an etch of a sacrificial oxide. In some aspects, methodology of the present invention can be incorporated into fabrication of any suitable transistor structure, including planar and non-planar structures. For instance, methodology of the present invention can be incorporated into fabrication of multi-gate devices, finFET devices, recessed access devices, gate-surround (e.g., gate-all-around) vertical transistors, etc. Devices having large interface areas can significantly benefit from passivation achieved through methodologies of the present invention.

In one aspect, the invention encompasses a method of forming and passivating a semiconductor construction. One or more oxides are formed over a semiconductor substrate by exposing semiconductor material of the substrate to deuterium-enriched steam. The semiconductor substrate with the one or more oxides thereover is defined to be at least a portion of a semiconductor construction. After the one or more oxides are formed, the semiconductor construction is subjected to an anneal at a temperature of greater than or equal to about 350° C. (and typically less than 525° C.) while exposing the construction to a deuterium-enriched ambient. The oxides can be referred to as "deuterated oxides" and can include, for example, gate oxide, re-oxidation stops, and thin buffer oxides (such as silicon dioxide) utilized in conjunction with high-k dielectric materials (such as, for example, hafnium oxide, aluminum oxide, etc.).

In one aspect, the invention encompasses another method of forming and passivating a semiconductor construction. At least one gate oxide is formed over a semiconductor substrate by exposing semiconductive material of the substrate to deuterium-enriched steam. At least one isolation region is formed by initially forming a trench in the semiconductive material of the substrate, and subsequently exposing the semiconductive material within the trench to a deuterium-enriched steam to form an oxide liner within the trench. A semiconductor substrate having the at least one gate oxide and at least one isolation region thereover is defined to be at least a portion of a semiconductor construction. The semiconductor construction is subjected to an anneal at a temperature of greater than or equal to about 350° C. while exposing the semiconductor construction to a deuterium-enriched ambient during or after final passivation.

BRIEF DESCRIPTION OF THE DRAWINGS

Preferred embodiments of the invention are described below with reference to the following accompanying drawings.

FIG. 1 is a diagrammatic, cross-sectional view of a fragment of a semiconductor construction illustrating various structures which can be formed in accordance with exemplary aspects of the present invention.

FIG. 2 is a diagrammatic, cross-sectional view of a fragment of a semiconductor construction shown at a preliminary processing stage of an exemplary method of the present invention.

DETAILED DESCRIPTION OF THE PREFERRED EMBODIMENTS

Figure 3:
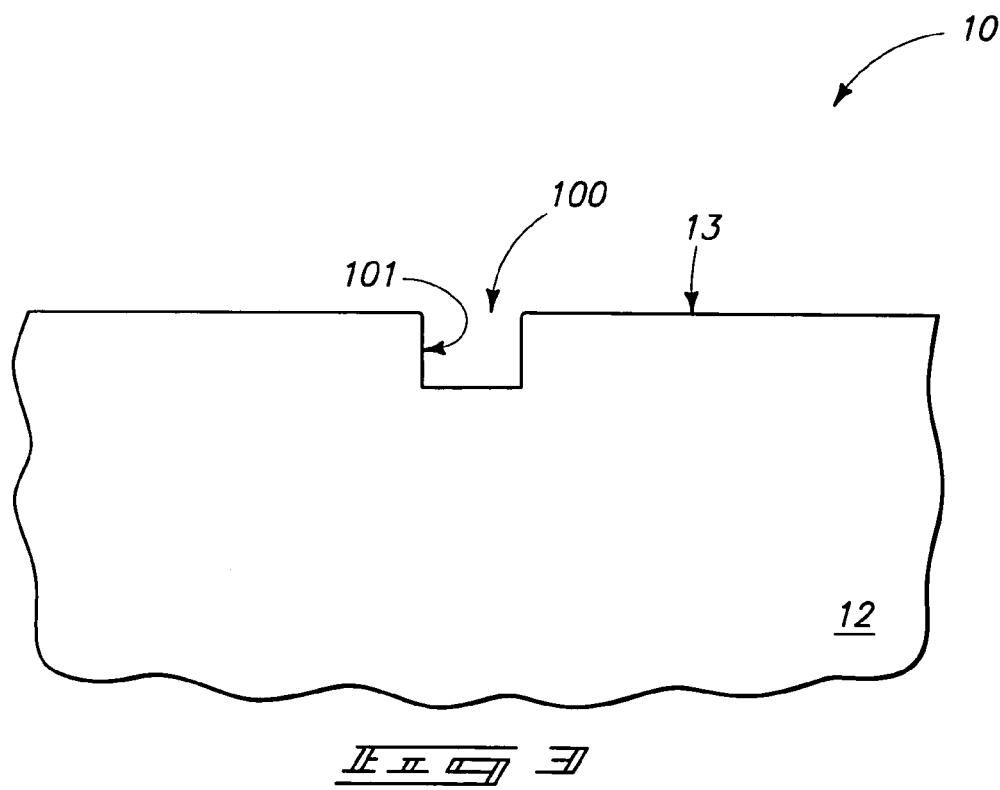
FIG. 3 is a view of the FIG. 2 wafer fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

The invention includes aspects in which deuterium-enriched steam is utilized during formation of various oxides associated with a semiconductor construction, as well as aspects in which a deuterium-enriched ambient is utilized during passivation of a semiconductor construction. It is found that synergistic effects occur when multiple oxides are formed utilizing deuterium-enriched steam, and also that synergistic effects are observed when passivation with a deuterium-enriched ambient follows such oxide formation. In other words, it is observed that there will be some improvement gained by forming a particular oxide from deuterium-enriched steam, and additional improvement obtained by forming another oxide from deuterium-enriched steam, but that the combined improvement from forming both oxides from deuterium-enriched steam will unexpectedly be greater than a simple sum of the improvements obtained in isolation from one another. Similarly, it is found that the utilization of a deuterium-enriched ambient during passivation will provide some improvement to the properties of various oxides, and that the coupling of passivation in a deuterium-enriched ambient with the formation of oxides from deuterium-enriched steam advantageously provides additional improvement beyond a simple sum of the individual improvements obtained by utilizing deuterium-enriched steam oxidation and deuterium-enriched ambient passivation.

An exemplary semiconductor construction 10 is shown in FIG. 1 to diagrammatically illustrate some of the various oxides which can be formed and treated in exemplary aspects of the present invention.

Construction 10 comprises a semiconductor substrate 12. Substrate 12 can, for example, comprise, consist essentially of, or consist of monocrystalline silicon lightly-doped with a background dopant concentration. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of transistor devices 14 and 16 are supported by substrate 12, and electrically isolated from one another by an isolation region 18.

The transistor constructions 14 and 16 comprise electrically conductive transistor gates 20 and 22, respectively. Such transistor gates can comprise one or more suitable electrically conductive compositions, including, for example one or more of, various metals, metal compounds (such as, for example, metal silicides), and conductively-doped silicon.

Transistor gate 20 is spaced from an upper surface of substrate 12 by a gate dielectric 24, and transistor gate 22 is spaced from an upper surface of substrate 12 by a gate dielectric 26. In the shown aspect of the invention, gate dielectric 26 is substantially thicker than gate dielectric 24. Gate dielectric 24 can have a thickness of, for example, about 25 Å to about 40 Å; and gate dielectric 26 can have a thickness of, for example, from about 50 Å to about 70 Å. Accordingly, gate dielectric 26 can be at least about 15 Å thicker than gate dielectric 24. The difference in thickness of the gate dielectrics can enable the threshold voltages of devices 14 and 16 to be tailored to be different from one another. The gate dielectric materials 24 and 26 comprise, consist essentially of, or consist of silicon dioxide, and can be formed utilizing a deuterium-enriched steam as discussed below with reference to FIGS. 6–10.

The transistor devices 14 and 16 comprise conductively-doped source/drain regions within the substrate 12 proximate the gates 20 and 22. Specifically, transistor device 14 comprises a pair of source/drain regions 28 proximate gate 20, and transistor device 16 comprises a pair of source/drain regions 30 proximate gate 22. The source/drain regions 28 comprise heavily-doped portions 27 and lightly-doped portions 29, and similarly the source/drain regions 30 comprise heavily-doped portions 31 and lightly-doped portions 33.

The source/drain regions correspond to conductively-doped diffusion regions formed within the semiconductor material of substrate 12, and can be either n-type or p-type. For instance, heavily-doped regions 27 of source/drain regions 28 can be either n-type or p-type, and lightly-doped regions 29 can be either the same conductivity type as heavily-doped regions 27 or an opposite conductivity type. Similarly, heavily-doped regions 31 of source/drain regions 30 can be either n-type or p-type, and lightly-doped regions 33 can be either the same conductivity type as heavily-doped regions 31 or an opposite conductivity type. Further, as will be recognized by persons of ordinary skill in the art, a source/drain region (such as the region 30) can comprise multiple lightly-doped regions associated with a single heavily-doped region, with one or more of the lightly-doped regions having the same conductivity type as the heavily-doped region, and one or more of the lightly-doped regions having an opposite conductivity type as the heavily-doped region.

Dielectric material 40 is formed over upper surfaces of conductively-doped diffusion regions corresponding to source/drains 28, and also extends along sidewall surfaces of gate 20. The dielectric material 40 is shown merging with gate dielectric 24, and accordingly is shown comprising the same composition as gate dielectric 24. Dielectric material 40 can thus comprise, consist essentially of, or consist of silicon dioxide, and in particular aspects will be formed by oxidation of silicon-containing surfaces of substrate 12 and gate 20 with a deuterium-enriched steam, as will be discussed in more detail below with reference to FIG. 13.

A dielectric material 42 extends over conductively-doped diffusion regions corresponding to source/drain regions 30 and along sidewall surfaces of gate 22, and merges with gate dielectric 26. Dielectric material 42 can comprise, consist essentially of, or consist of silicon dioxide, and can be formed by oxidation of exposed silicon-containing surfaces of substrate 12 and gate 22 with a deuterium-enriched steam, as will be discussed in more detail below with reference to FIG. 13.

Transistor constructions 14 and 16 comprise insulative material caps 44 and 46, respectively, over gates 20 and 22, and comprise insulative material sidewall spacers 48 and 50, respectively, along sidewalls of the gates 20 and 22. The caps and spacers can comprise any suitable electrically insulative compositions, and in particular aspects can comprise, consist essentially of, or consist of silicon nitride.

The isolation region 18 comprises electrically insulative materials 52, 54 and 56 formed within a trench extending within substrate 12. Electrically insulative material 52 can, for example, comprise, consist essentially of, or consist of silicon dioxide formed by oxidation of semiconductor material substrate 12 under deuterium-enriched steam, as will be discussed in more detail below with reference to FIG. 4. Electrically insulative material 54 can, for example, comprise, consist essentially of, or consist of silicon nitride. Electrically insulative material 56 can, for example, comprise, consist essentially of, or consist of silicon dioxide. The shown isolation region can correspond to a so-called shallow trench isolation region.

The construction of FIG. 1 is provided to diagrammatically illustrate various oxides which can be formed in accordance with exemplary methodology of the present invention. The illustration of FIG. 1 is for diagrammatic purposes only, and it is to be understood that the transistor devices 14 and 16 and isolation region 18 are representative of classes of devices which can be formed over a semiconductor substrate. Specifically, transistor device 14 represents a class of devices which can be formed to have a relatively thin gate dielectric, transistor device 16 represents a class of devices which can be formed to have a relatively thick gate dielectric, and isolation region 18 represents a class of structures which can be utilized to electrically isolate adjacent transistor devices from one another. The various devices can be formed in the arrangement of FIG. 1, or can be formed in other arrangements, as will be understood by persons of ordinary skill in the art. Exemplary methods of forming the various classes of structures of the FIG. 1 construction are described with reference to FIGS. 2–14. In referring to FIGS. 2–14, similar numbering will be used as was utilized above in describing FIG. 1, where appropriate.

Referring to FIG. 2, substrate 12 is shown at a preliminary processing stage. Substrate 12 can correspond to any suitable semiconductor substrate, including, for example, bulk monocrystalline silicon, a silicon-on-insulator assembly, etc. Although the semiconductor substrate 12 is described as comprising silicon, it is to be understood that the invention also encompasses aspects in which the substrate comprises other semiconductor materials either in addition to, or alternatively to, silicon. Such other semiconductor materials can include, for example, germanium. The substrate 12 has an uppermost surface 13 comprising semiconductor material. Although substrate 12 is shown having a homogeneous composition, it is to be understood that substrate 12 can comprise multiple materials having different compositions relative to one another. Regardless, substrate 12 will typically comprise an uppermost surface 13 containing a semiconductor composition.

Referring next to FIG. 3, an opening 100 is etched through the uppermost surface 13 of substrate 12. The opening 100 can correspond to a trench which extends longitudinally into and out of the page relative to the shown FIG. 3 cross-section. Opening 100 is surrounded by a periphery 101 of semiconductor material of substrate 12. In particular aspects, periphery 101 and surface 13 can comprise, consist essentially of, or consist of silicon.

Figure 4:
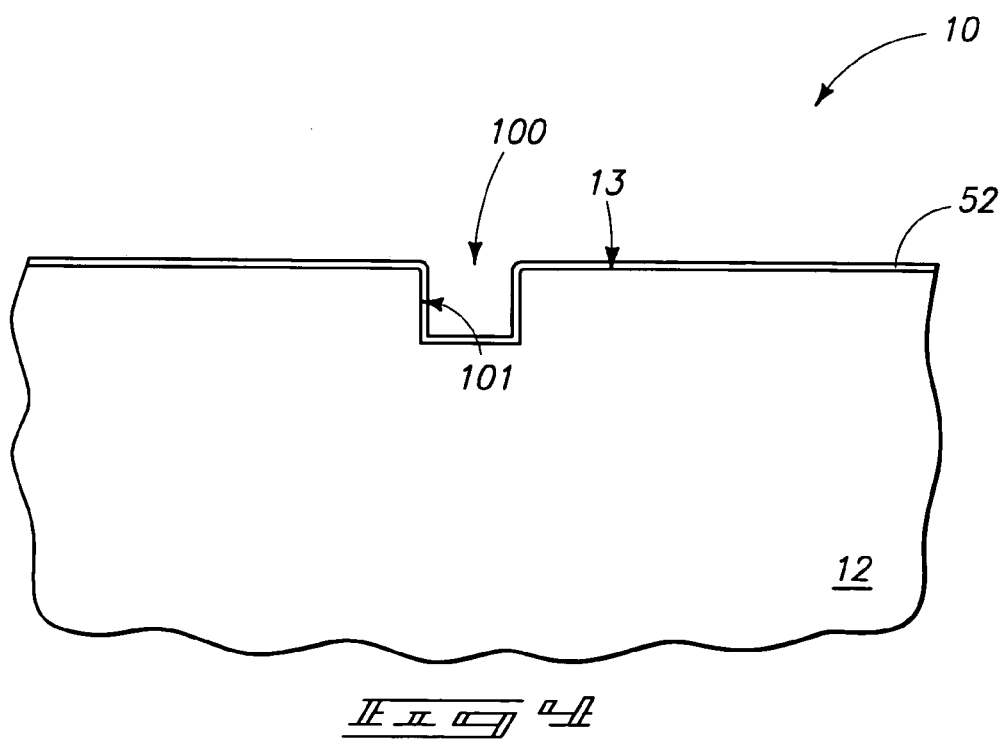
FIG. 4 is a view of the FIG. 2 wafer fragment shown at a processing stage subsequent to that of FIG. 3.

Referring next to FIG. 4, semiconductor material of surface 13 and periphery 101 is subjected to thermal oxidation to form an oxide 52 extending across the upper surface 13 and within the opening 100. Oxide 52 can, in particular aspects of the invention, comprise, consist essentially of, or consist of silicon dioxide. The oxide 52 is preferably formed by exposure of surfaces 13 and 101 to a deuterium-enriched steam. The deuterium-enriched steam is defined to comprise a greater isotopic abundance of deuterium relative to other hydrogen isotopes than the naturally-occurring isotopic abundance of deuterium. In particular aspects, the isotopic abundance of deuterium relative to other hydrogen isotopes within the steam will be greater than 0.02%, at least about 1%, at least about 10%, at least about 25%, at least about 50%, at least about 75%, or even about 100%. The exposure to the deuterium-enriched steam can occur within a reaction chamber, and the deuterium-enriched steam can, in particular aspects, be formed in-situ within the chamber from deuterium-enriched molecular hydrogen and $O_2$. As will be understood by persons of ordinary skill in the art, molecular hydrogen is $H_2$, and accordingly deuterium-enriched molecular hydrogen comprises various combinations of $D_2$, DH and $H_2$, with the relative proportions of the various hydrogen isotopes varying depending on among other things, the level of deuterium enrichment of the molecular hydrogen. The exposure to the deuterium-enriched steam can comprise any suitable method, and can be utilized with batch systems as well as with single wafer systems.

The utilization of deuterium-enriched steam to form oxide 52 provides advantages relative to utilization of regular steam (i.e., steam which is not enriched in deuterium) in that there will typically be some dangling silicon bonds generated during formation of the oxide, and hydrogen isotopes from the steam will adhere to the silicon through such dangling bonds. It can be advantageous if deuterium is adhered to the silicon rather than hydrogen, in that deuterium-to-silicon bonds be more resilient to vibrationally-induced breakage than silicon-to-hydrogen bonds. Specifically, the vibrational energy states of silicon-to-deuterium bonds can be better-suited for dissipating energy without breakage of the bonds than can be the vibrational energy states of silicon-to-hydrogen bonds. In addition, since deuterium is a heavier element than hydrogen, it diffuses less in silicon than hydrogen. Therefore, if a Si-D bond were to break (due to, for example, high current density and/or high electric fields), "D" stays relatively close to the silicon dangling bond, increasing the probability of Si-D bond formation and resulting re-passivation.

Figure 5:
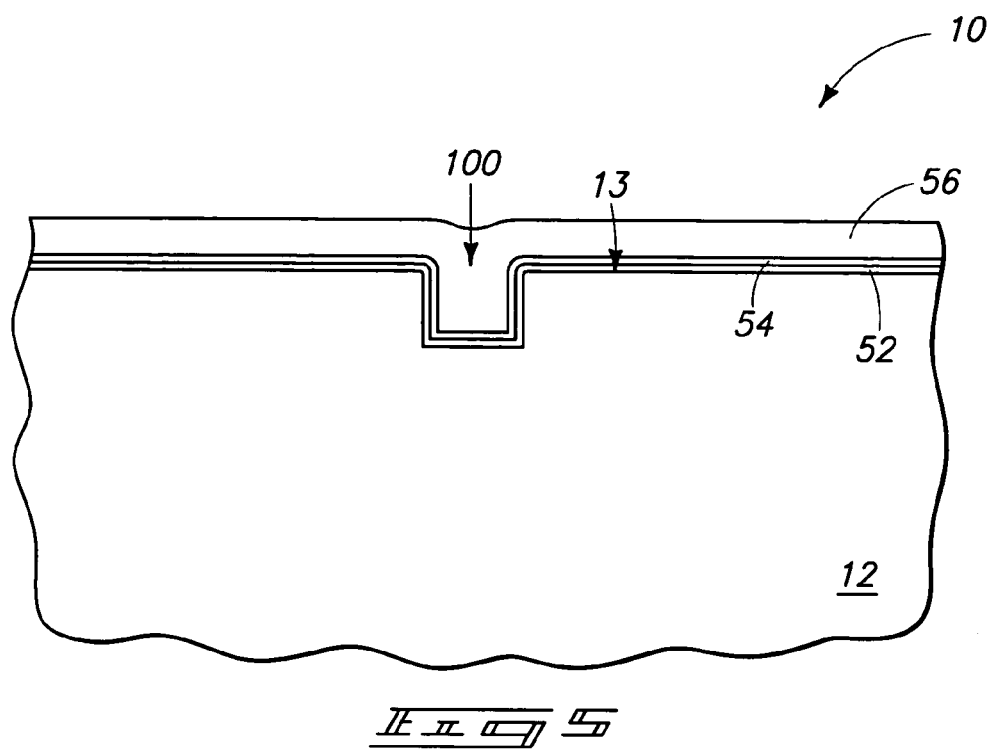
FIG. 5 is a view of the FIG. 2 wafer fragment shown at a processing stage subsequent to that of FIG. 4.

Referring next to FIG. 5, the oxide 52 can be considered to be a liner extending within trench 100. A film 54 is formed over the liner and within the trench to narrow the trench, and subsequently an insulative material 56 is formed over film 54 to fill the narrowed trench. In particular aspects, liner 52 can comprise, consist essentially of, or consist of silicon dioxide; film 54 can comprise, consist essentially of, or consist of silicon nitride; and insulative material 56 can comprise, consist essentially of, or consist of silicon dioxide. Film 54 and insulative material 56 can be formed by any suitable methods, including, for example, atomic layer deposition (ALD) and/or chemical vapor deposition (CVD).

Figure 6:
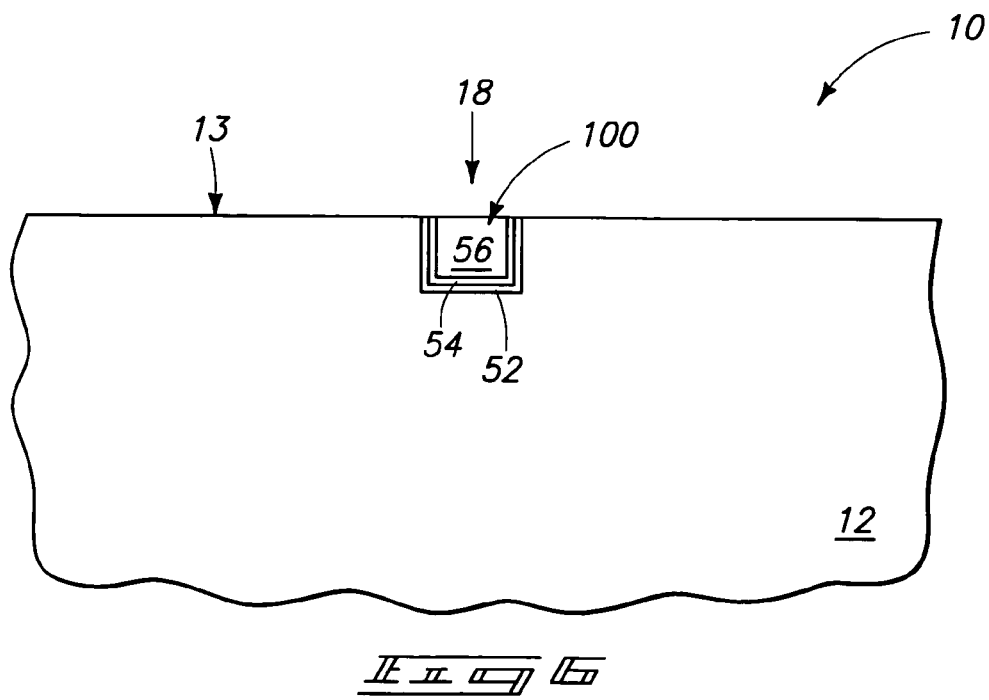
FIG. 6 is a view of the FIG. 2 wafer fragment shown at a processing stage subsequent to that of FIG. 5.

Referring to FIG. 6, construction 10 is subjected to planarization, (such as, for example, chemical-mechanical polishing) to remove layers 52, 54 and 56 from over surface 13 of substrate 12 while leaving the insulative materials 52, 54 and 56 within trench 100. Such completes formation of isolation region 18. The planarization utilized to remove materials 52, 54 and 56 from over surface 13 can stop at the initial elevational level of surface 13, or can remove some of substrate 12 so that the elevational level of surface 13 of FIG. 6 is beneath the starting elevational level of such surface in the preliminary processing stage of FIG. 2.

Figure 7:
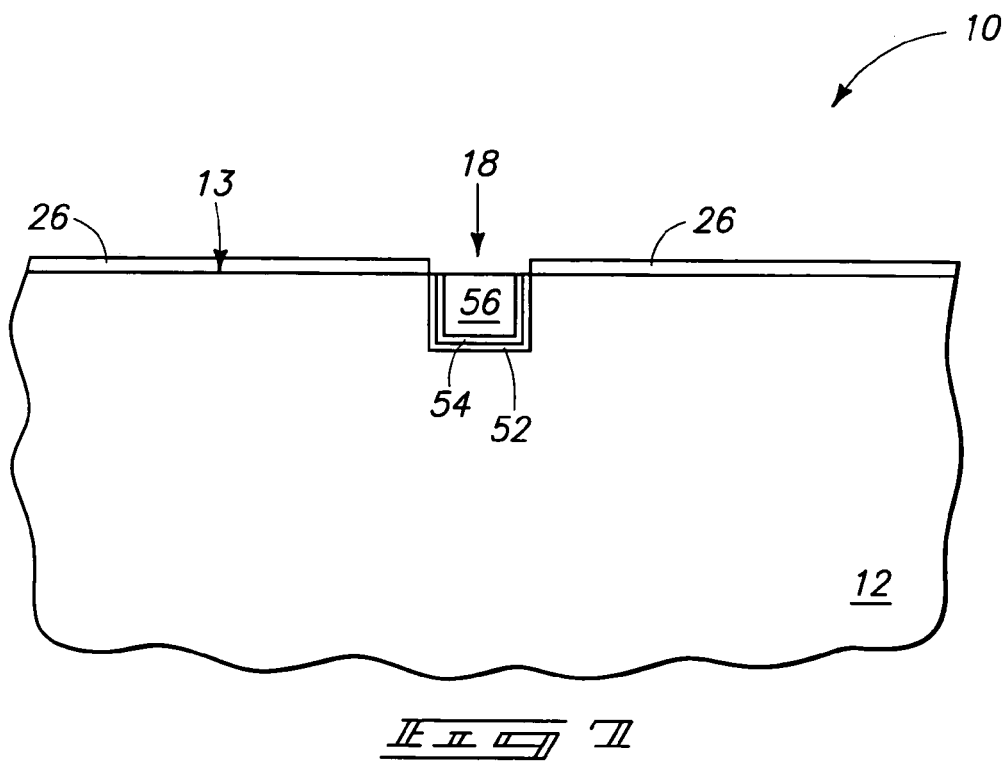
FIG. 7 is a view of the FIG. 2 wafer fragment shown at a processing stage subsequent to that of FIG. 6.

FIGS. 7–10 describe formation of the gate dielectric materials 24 and 26 of FIG. 1. Referring to FIG. 7, construction 10 is shown at a processing stage subsequent to that of FIG. 6, and specifically is shown after oxide 26 is formed across upper surface 13 of substrate 12. Oxide 26 is preferably formed by exposing upper surface 13 of substrate 12 to deuterium-enriched steam to thermally grow material 26, and can be formed under conditions identical to those discussed above with reference to FIG. 4 for growing the oxide material 52. Material 26 can, in particular aspects, comprise, consist essentially of, or consist of silicon dioxide, and can be formed to a thickness of at least about 50 Å. Although material 26 is not shown extending across isolation region 18, it is to be understood that the layer can extend laterally over the isolation region in some aspects of the invention, and further that some of the electrically-insulative materials of the isolation region (such as, for example, a silicon nitride layer 54) can be thermally oxidized under the conditions utilized to oxidize surface 13. The advantages of utilizing deuterium-enriched steam for forming oxide 26 are similar to those discussed above relative to formation of oxide 52.

Figure 8:
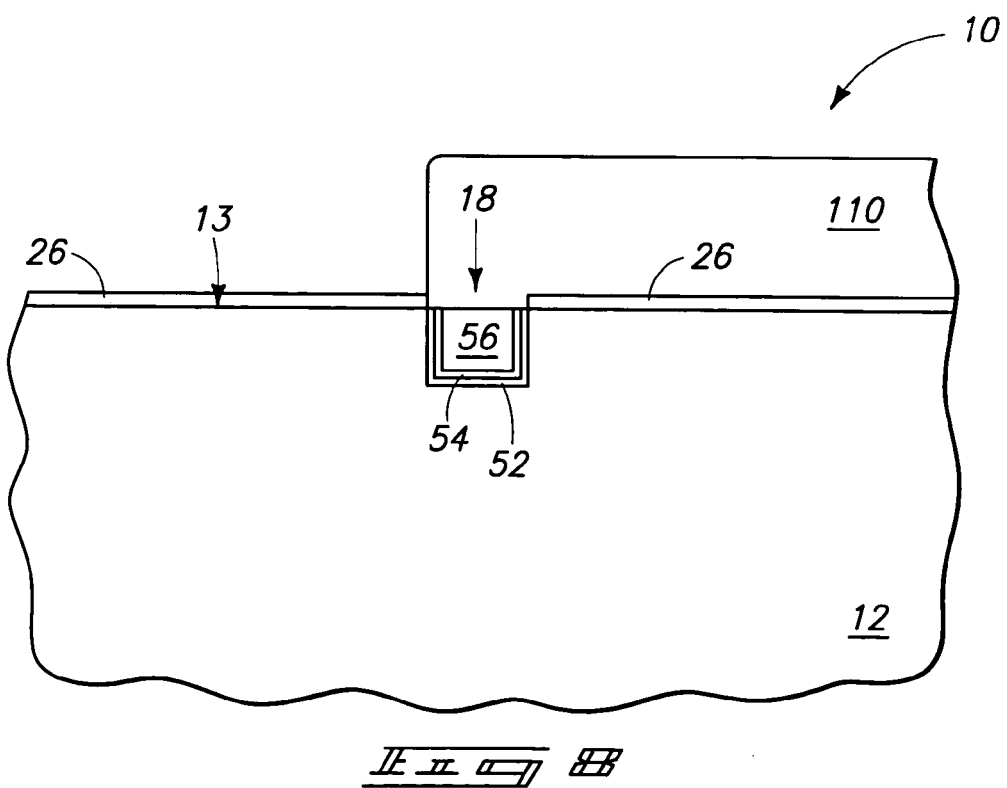
FIG. 8 is a view of the FIG. 2 wafer fragment shown at a processing stage subsequent to that of FIG. 7.

Referring to FIG. 8, a masking material 110 is formed over oxide 26 and patterned to protect a segment of oxide 26 while leaving another segment exposed. Masking material 110 can comprise, for example, photoresist, and can be patterned utilizing photolithographic processing. The shown patterned mask of material 110 extends across isolation region 18 to protect the materials of such isolation region from a subsequent etch.

Figure 9:
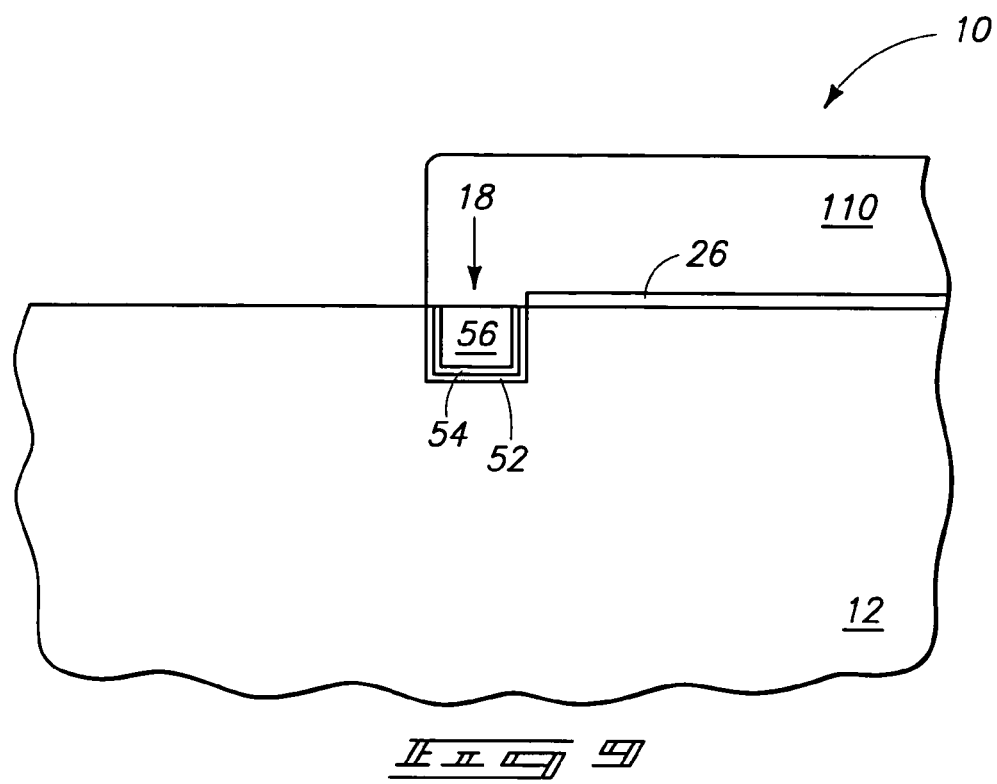
FIG. 9 is a view of the FIG. 2 wafer fragment shown at a processing stage subsequent to that of FIG. 8.

Referring next to FIG. 9, exposed portions of oxide 26 are subjected to an etch to remove such exposed portions from over substrate 12.

Figure 10:
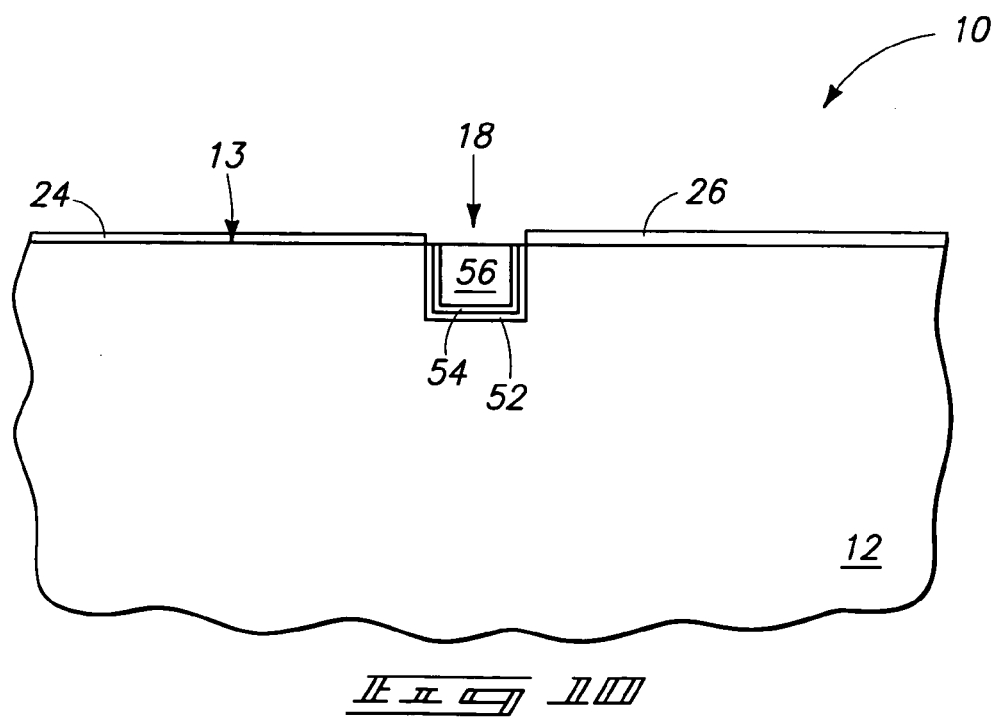
FIG. 10 is a view of the FIG. 2 wafer fragment shown at a processing stage subsequent to that of FIG. 9.

Referring next to FIG. 10, oxide 24 is formed over the exposed region of substrate 12, and mask 110 is removed. Oxide 24 can be formed by thermal oxidation of surface 13 of substrate 12 utilizing deuterium-enriched steam under conditions similar to those utilized for forming oxide 26. However, oxide 24 is shown formed to a thickness different than that of oxide 26. Specifically, oxide 24 is shown formed to be thinner than oxide 26. In particular aspects, oxide 24 can be from about 25 Å thick to about 40 Å, and accordingly it will be at least about 15 Å thinner than oxide 26. As indicated above in describing FIG. 1, the utilization of a different thickness gate oxide for some transistors than others can enable threshold voltages of the various transistors to be specifically tailored for particular applications. Specifically, a transistor device having a thin gate dielectric can have a different threshold voltage than a transistor device having a thick gate dielectric. Frequently, some of the transistor devices formed across a semiconductor substrate will have different functions than others, and the optimal threshold voltage of the various transistors will vary depending on the functions of the transistors. Accordingly, it can be advantageous to be able to tailor the threshold voltages of the various transistors.

The mask 110 can be removed before or after the thermal oxidation utilized to form oxide 24. If the mask is removed before such thermal oxidation, there can be an increase in the thickness of oxide 26 occurring during the thermal oxidation utilized to form oxide 24. For instance, if oxide 24 is formed to be about 35 Å thick, and oxide 26 was initially 50 Å thick, the oxide 26 can grow to be about 58 Å thick during the thermal oxidation utilized to form oxide 24. Oxides 26 and 24 can be referred to as first and second oxides, respectively, in order to distinguish the oxides from one another in referring to some aspects of the invention.

Figure 11:
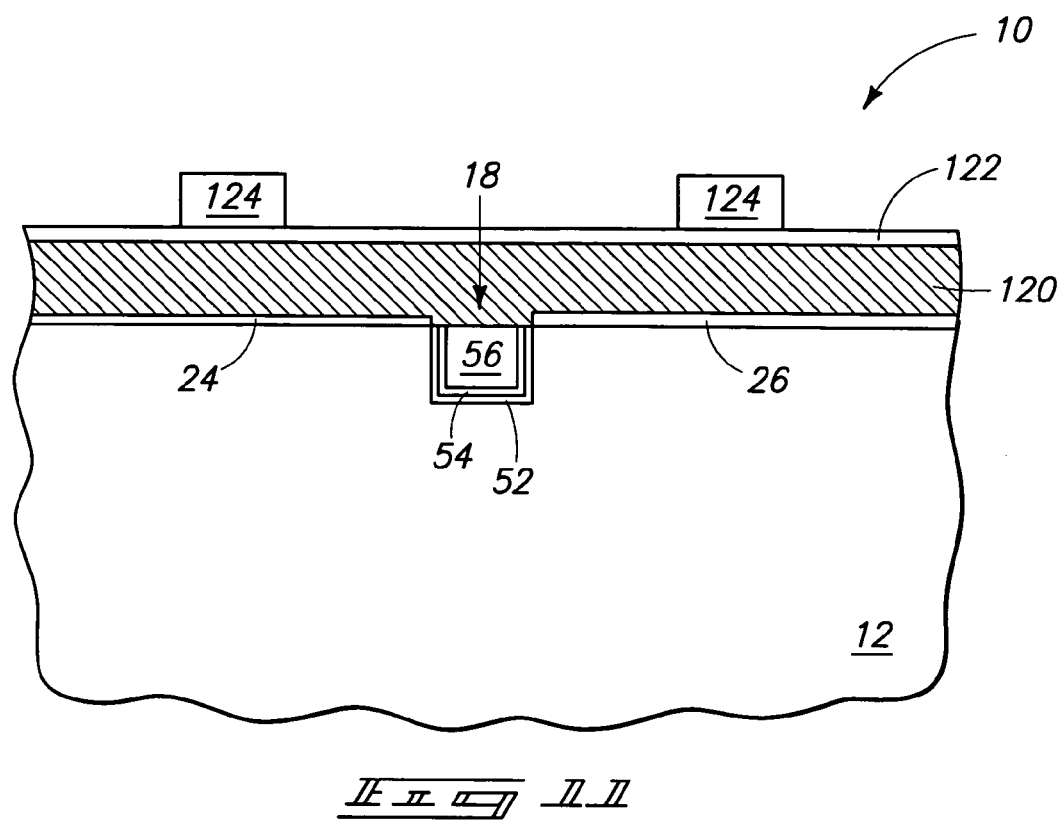
FIG. 11 is a view of the FIG. 2 wafer fragment shown at a processing stage subsequent to that of FIG. 10.

Referring next to FIG. 11, gate material 120 and capping material 122 are formed over substrate 12, and specifically over oxide regions 24 and 26. The material 120 can comprise any suitable composition or combination of compositions for forming electrically conductive transistor gates, and in particular aspects will include at least a portion which comprises, consists essentially of, or consists of conductively-doped semiconductor material (such as, for example, conductively-doped silicon). Capping material 122 can comprise any suitable electrically insulative composition or combination of compositions, and in particular aspects will comprise, consist essentially of, or consist of silicon nitride.

A patterned mask 124 is formed over layers 120 and 122. Mask 124 can comprise, for example, photoresist patterned utilizing photolithographic processing.

Figure 12:
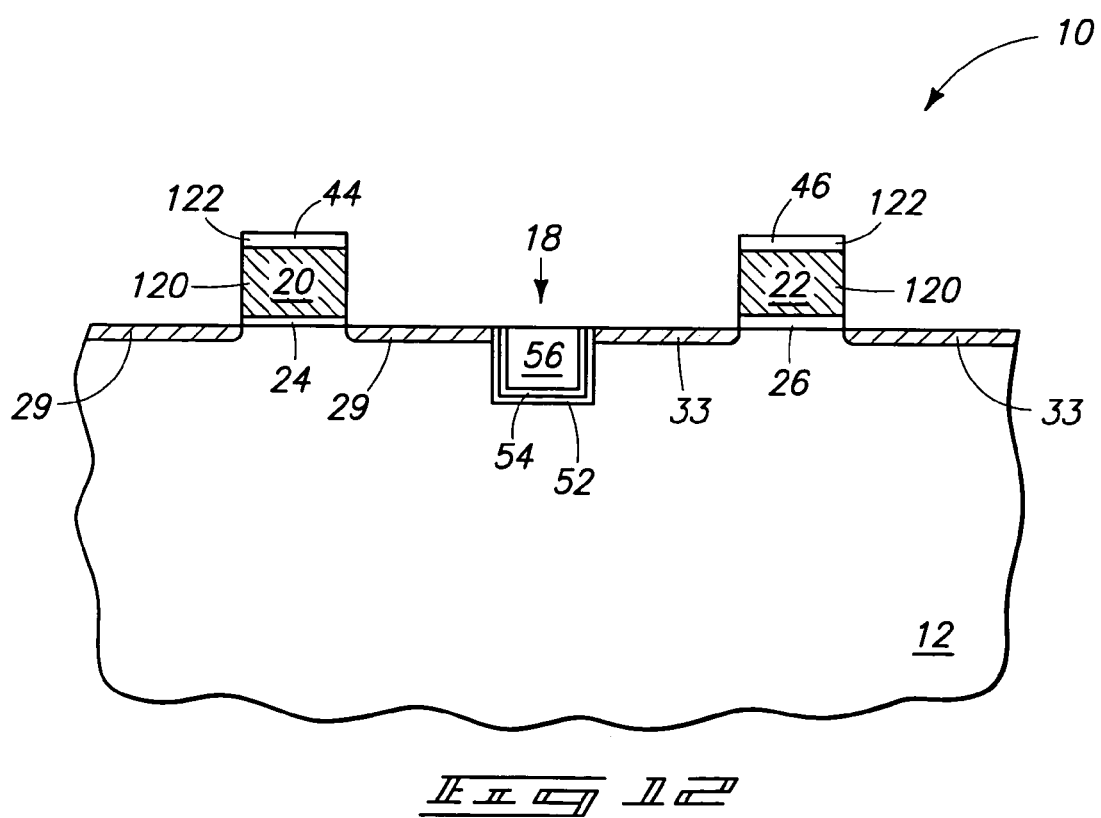
FIG. 12 is a view of the FIG. 2 wafer fragment shown at a processing stage subsequent to that of FIG. 11.

Referring next to FIG. 12, a pattern from mask 124 (FIG. 11) is transferred to underlying materials 24, 26, 120 and 122, and subsequently mask 124 is removed. The patterned material 120 forms transistor gates 20 and 22, and the patterned material 122 forms electrically insulative caps 44 and 46. Though gates 20 and 22 are shown formed from the same electrically conductive material 120 as one another, it is to be understood that the gates can also be formed from different electrically conductive materials relative to one another so that the gates have different compositions relative to one another. Similarly, the caps 44 and 46 can be formed from the same materials as one another (as shown), or in other aspects can be formed from different electrically insulative materials relative to one another.

Lightly-doped source/drain regions 29 and 33 are shown implanted after the patterning of gates 20 and 22 so that the source/drain regions are self-aligned relative to the gates. It is to be understood that the source/drain regions can be implanted at other processing stages in addition to, or alternatively to, the shown processing stage.

Figure 13:
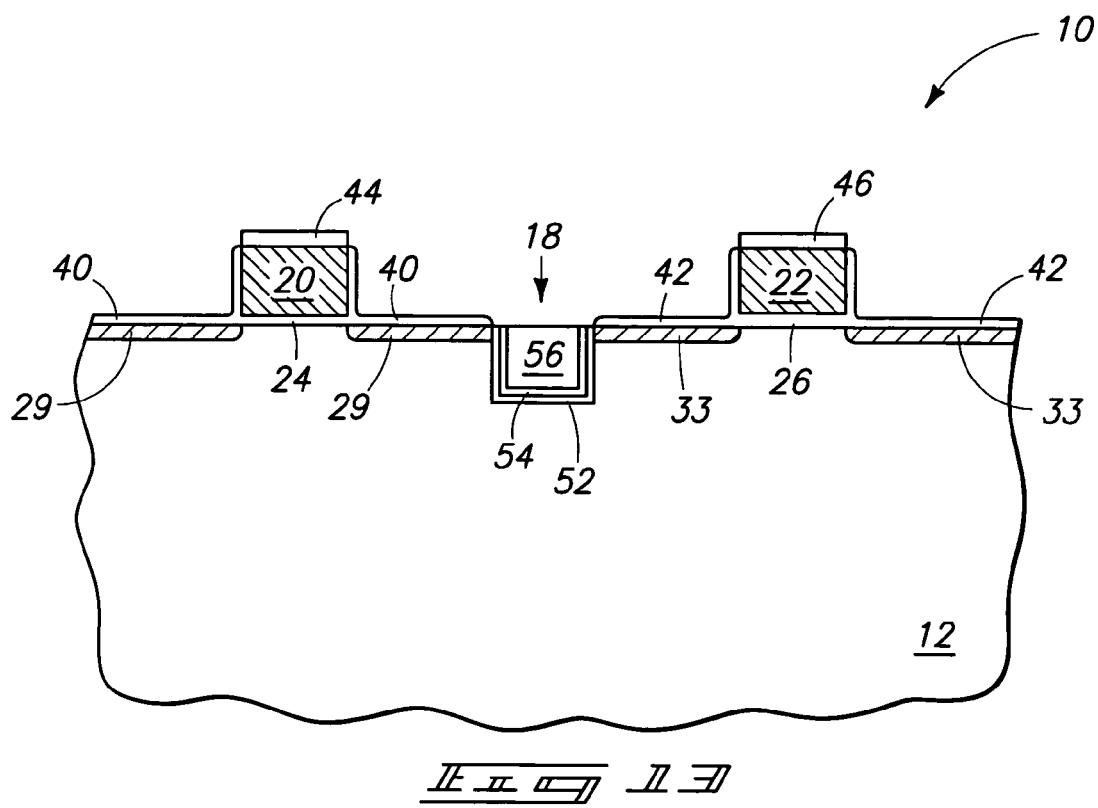
FIG. 13 is a view of the FIG. 2 wafer fragment shown at a processing stage subsequent to that of FIG. 12.

Referring next to FIG. 13, construction 10 is subjected to thermal oxidation which forms oxide 40 over source/drain regions 29 and along sidewalls of gate 20, and which forms oxide 42 over source/drain regions 33 and along sidewalls of gate 22. The thermal oxidation preferably comprises exposure of substrate 10 to deuterium-enriched steam, and processing similar to that discussed previously with reference to formation of oxide 52 of FIG. 4. The composition of oxides 40 and 42 depends on the compositions of the surfaces which are thermally oxidized to form oxides 40 and 42. In particular aspects, oxides 40 and 42 can comprise, consist essentially of, or consist of silicon dioxide. The formation of oxides 40 and 42 transforms gates 20 and 22 into so-called smiling gate constructions, or in other words rounds the lowermost corners of the gates. Such can be advantageous for improving performance and reliability of transistors comprising the gates, as will be understood by persons of ordinary skill in the art. An advantage of utilizing deuterium-enriched steam for forming oxides 40 and 42 is similar to the advantage discussed above with reference to formation of oxide 52.

In the shown aspect of the invention, oxides 40 and 42 are formed over conductively-doped regions 29 and 30 of substrate 12, and specifically are formed from surfaces of the conductively-doped regions. It is to be understood that the invention encompasses other aspects in which the conductivity-enhancing dopant of the source/drain regions is not provided prior to the oxidation of a surface which will ultimately be over such source/drain regions. Regardless, substrate 12 can be understood to have locations therein where source/drain regions will ultimately be formed, and such locations can be referred to as source/drain region locations. The oxidation to form regions 40 and 42 can thus be understood to oxidize portions of substrate 12 corresponding to uppermost surfaces of source/drain region locations.

Figure 14:
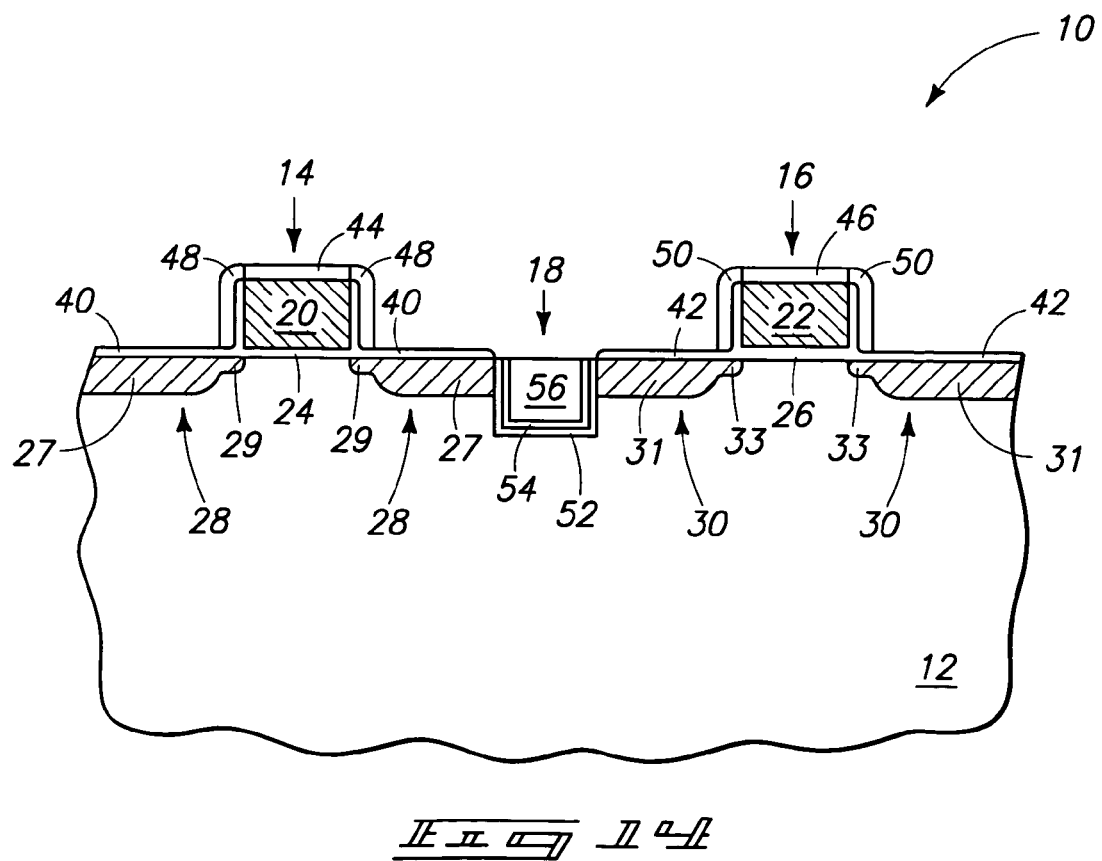
FIG. 14 is a view of the FIG. 2 wafer fragment shown at a processing stage subsequent to that of FIG. 13. The wafer fragment of FIG. 14 is identical to that previously described with reference to FIG. 1.

Referring next to FIG. 14, construction 10 is illustrated after formation of sidewall spacers 48 and 50, and after the implant of heavily-doped source/drain regions 27 and 31. The spacers 48 and 50 can be formed by, for example, forming a layer of insulative material across a surface of construction 10 and subsequently subjecting such insulative material to anisotropic etching. The heavily-doped source/drain regions 27 and 31 can be implanted after formation of spacers 48 and 50 so that the heavily-doped source/drain regions are self-aligned relative to the laterally outward edges of the spacers. The source/drain regions 27 and 31 can be simultaneously implanted in applications in which the source/drain regions 27 are identical to the source/drain regions 31. In other applications, source/drain regions 27 and 31 can be sequentially implanted relative to one another. If the regions are implanted sequentially relative to one another, a mask can be utilized to block the location of either source/drain regions 27 or source/drain regions 31 while the other of the source/drain regions is implanted, and subsequently another mask can be utilized to block the implanted source/drain regions while the remaining source/drain regions are implanted.

The construction of FIG. 14 is identical to that of FIG. 1. Any of the oxides 24, 26, 40, 42 and 52 can be formed by thermal oxidation with deuterium-enriched steam. Preferably, at least two of the oxides are formed by thermal oxidation with deuterium-enriched steam, and even more preferably, all of the oxides are formed by thermal oxidation with deuterium-enriched steam. It is found that the improvements obtained by utilizing deuterium-enriched steam can enhance one another so that there is an advantageous improvement obtained in forming multiple oxides from deuterium-enriched steam beyond the simple addition of improved effects. In other words, there can be synergy between the improvements obtained through using deuterium-enriched steam for forming multiple oxides.

In the shown aspect of the invention, all of the oxide of materials 24, 26, 40, 42 and 52 is formed by thermal oxidation, but it is to be understood that the thicknesses of the various oxides can be increased by adding additional insulative layers onto the oxides after the thermal oxidation. Accordingly, the invention encompasses aspects (not shown) in which only portions of one or more of the oxides 24, 26, 52, 40 and 42 are formed by thermal oxidation, and in which other portions are subsequently deposited onto the portions formed by thermal oxidation. The amount of a particular oxide formed by thermal oxidation with a deuterium-enriched steam can vary from an entirety of the oxide, to substantially all of the oxide, to a predominate portion of the oxide, to less than a predominate portion of the oxide.

Figure 15:
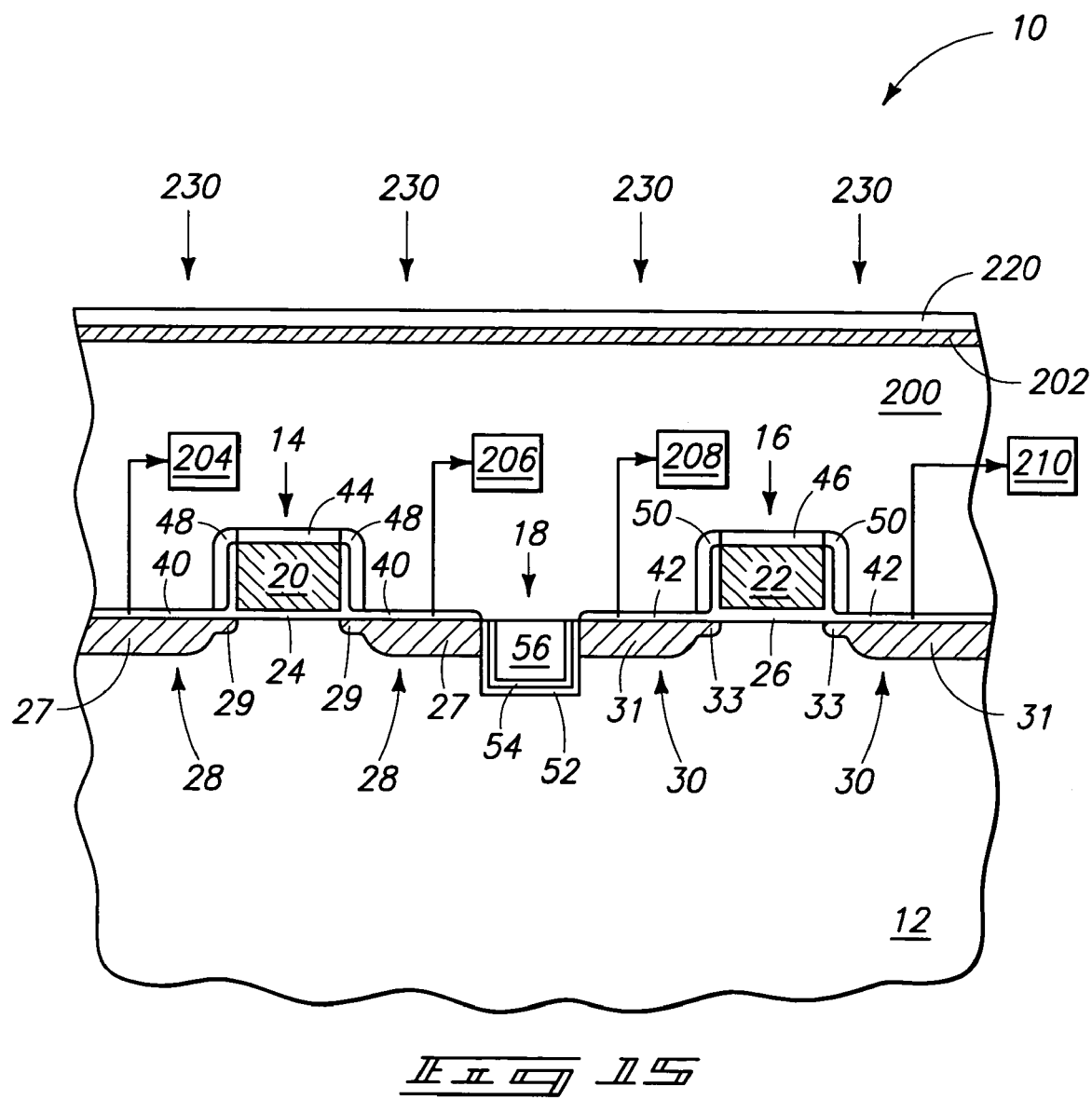
FIG. 15 is a view of the FIG. 2 wafer fragment shown at a processing stage subsequent to that of FIG. 14.

FIG. 15 shows the construction of FIG. 14 after subsequent processing has been conducted to form one or more insulative masses over transistor constructions 14 and 16 (with an exemplary insulative mass being represented by mass 200), and to form one or more conductive layers over the transistor constructions (with an exemplary conductive layer being illustrated by the layer 202). The conductive layers can correspond to so-called metal I, metal II, metal III, etc. layers.

The source/drain regions 28 and 30 of the transistor constructions are shown electrically connected with circuit devices 204, 206, 208 and 210. In particular aspects, the transistor constructions can be incorporated into dynamic random access memory (DRAM) arrays, and accordingly each transistor will have a source/drain region connected to a bitline, and another source/drain region connected to a charge-storage device (such as, for example, a capacitor). In other aspects, one or both of the transistors can be incorporated into logic devices or other circuitry.

The shown conductive layer 202 can correspond to an uppermost conductive layer ultimately formed over construction 10, and in particular aspects can correspond to the uppermost metal layer. A passivation layer 220 is formed over conductive layer 202. Passivation layer 220 can comprise, for example, hydrogen-enriched silicon nitride. The hydrogen of the hydrogen-enriched silicon nitride layer 220 can comprise about a natural isotopic abundance of deuterium, or can comprise a greater concentration of deuterium than the natural isotopic abundance of deuterium. In particular aspects, the hydrogen-enriched silicon nitride layer can comprise at least a two-fold greater concentration of deuterium than a natural isotopic abundance of deuterium, and in other aspects can comprise at least a ten-fold greater concentration of deuterium than the natural isotopic abundance of deuterium. However, it can be preferred that the layer 220 comprise only the natural isotopic abundance of deuterium, in that it is generally found that there is little benefit to having additional deuterium within the hydrogen-enriched silicon nitride layer, and it is significantly more expensive to form the silicon-enriched nitride layer 220 to have a concentration of deuterium higher than the natural abundance of deuterium.

The oxides formed in the processing of FIGS. 2–14 can have defects therein which are introduced during formation of the oxides, or which are introduced during subsequent processing of construction 10. Such defects can be alleviated through passivation conducted at a late processing stage. For instance, the construction 10 of FIG. 15 can be exposed to an anneal while also being exposed to a passivating ambient 230. The anneal can be referred to as an alloy anneal, in that one of the aspects of the anneal can be to treat various metal alloys within construction 10 to improve various properties of the alloys. The anneal can be conducted at a temperature of, for example, at least about 350° C., and typically will be conducted at a temperature of from about 350° C. to about 450° C. (with an exemplary temperature being from about 400° C. to about 425° C.) at a pressure equal to or greater than atmospheric pressure. The passivating ambient 230 diffuses into construction 10 during the anneal, and can be utilized to cure various defects which would otherwise be present in structures of construction 10. For instance, the ambient utilized during the anneal can comprise components which diffuse into construction 10 to cure defects associated with oxides and other dielectric materials. It can be preferred that ambient 230 be a deuterium-enriched ambient, as such can offer advantages for passivating construction 10 over those of non-deuterium enriched ambients. In particular aspects, the ambient will comprise deuterium-enriched molecular hydrogen, and specifically will comprise one or both of $D_2$ and DH.

Utilization of a deuterium-enriched ambient 230 during passivation can provide synergistic effects in combination with the utilization of deuterium-enriched steam during formation of oxides. Specifically, it is found that if a non-deuterium-enriched ambient is utilized during the passivation, some of the advantages that would otherwise be manifested from utilization of deuterium-enriched steam during formation of the various oxides of construction 10 can be reduced or even eliminated. In contrast, if a deuterium-enriched ambient is utilized during the passivation, the advantages achieved through utilization of deuterium-enriched steam during formation of the oxides can be enhanced. In some aspects, it is found that devices formed utilizing deuterium-enriched steam for formation of oxides are less than adequate to achieve desired tolerances, and that it is the combination of utilization of deuterium-enriched steam during formation of oxides and the utilization of deuterium-enriched ambients during passivation that achieves device characteristics suitable to be within desired tolerances of the devices.

The invention has numerous aspects achievable by utilization of deuterium-enriched steam during oxidation and/or utilization of a deuterium-enriched ambient during passivation. In some aspects, the invention can be understood as utilization of deuterium-enriched steam during any or all thermal oxidations utilized for fabrication of a semiconductor construction, and such aspects can be coupled with utilization of deuterium-enriched ambients during passivation of the construction. In particular aspects, the invention can be understood as including methods of forming semiconductor constructions wherein two or more separate thermal oxidation steps are conducted in the presence of deuterium-enriched steam and/or in which at least one thermal oxidation step is conducted in the presence of deuterium-enriched steam and in which passivation of a semiconductor construction comprising the oxide formed from the deuterium-enriched steam is conducted while exposing the construction to a deuterium-enriched ambient.

Semiconductor constructions formed in accordance with methodology of the present invention can advantageously have oxides which are more stable and less likely to become depassivated and electrically active after thermal stress or electrical stress than would structures formed without utilization of either or both of deuterium-enriched steam during thermal oxidation and deuterium-enriched ambients during passivation.

Methodology of the present invention can be incorporated into fabrication of any suitable transistor structure, including planar and non-planar structures. For instance, methodology of the present invention can be incorporated into fabrication of multi-gate devices, finFET devices, recessed access devices, gate-surround (e.g., gate-all-around) vertical transistors, etc. Devices having large interface areas can significantly benefit from passivation achieved through methodologies of the present invention.

The oxides formed in particular aspects of the invention can be referred to as "deuterated oxides". Such oxides can correspond to thermally-grown silicon dioxide, and can be utilized as, for example, gate oxide, re-oxidation stops, and thin buffer oxides (such as silicon dioxide) used in conjunction with high-k dielectric materials (such as, for example, hafnium oxide, aluminum oxide, etc.).

Numerous improvements in device performance can be achieved utilizing deuterated materials formed in accordance with various methodologies of the present invention. Such improvements can include, for example, improvement in refresh performance, performance of weak refresh bits in the tail distribution, and improvement in diode leakage in diodes with interfaces to dielectrics.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising of the following five steps in any order relative to one another:
   (1) forming at least a portion of a first gate oxide by exposure of a semiconductor material to deuterium-enriched steam, the first gate oxide having a first thickness;
   (2) forming at least a portion of a second gate oxide by exposure of a semiconductor material to deuterium-enriched steam, the second gate oxide having a second thickness which is at least about 15 Å less than the first gate oxide;
   (3) forming at least a portion of an oxide over a defined location of a conductively-doped region of a semiconductor material by exposure of the semiconductor material to deuterium-enriched steam;
   (4) forming at least a portion of an isolation region by exposure of a semiconductor material to deuterium-enriched steam; and
   (5) subjecting a semiconductor assembly to an anneal at a temperature of greater than or equal to about 350° C. while exposing the assembly to a deuterium-enriched ambient.

2. The method of claim 1 wherein at least some conductive doping of the defined location of the conductively-doped region of step (3) is provided after forming said oxide over the conductively-doped region.

3. The method of claim 1 wherein at least some conductive-doping of the defined location of the conductively-doped region of step (3) is provided before forming said oxide over the conductively-doped region.

4. The method of claim 1 wherein the semiconductor material of steps (1) and (2) is monocrystalline silicon.

5. The method of claim 1 wherein the first gate oxide is formed to a thickness of from about 25 Å to about 40 Å.

6. The method of claim 1 wherein substantially all of the first gate oxide is formed by step (1), wherein substantially all of the second gate oxide is formed by step (2), and further comprising:
   forming first conductive transistor gate over the first gate oxide; and
   forming a second conductive transistor gate over the second gate oxide.

7. The method of claim 6 further comprising forming source/drain regions proximate the first and second conductive transistor gates, the source/drain regions corresponding to conductively-doped regions treated in step (3).

8. A method of forming a semiconductor construction, comprising at least steps (1) and (4) of the following five steps in any order relative to one another:
   (1) forming at least a portion of a first gate oxide by exposure of a semiconductor material to deuterium-enriched steam, the first gate oxide having a first thickness;
   (2) forming at least a portion of a second gate oxide by exposure of a semiconductor material to deuterium-enriched steam, the second gate oxide having a second thickness which is at least about 15 A less than the first gate oxide;
   (3) forming at least a portion of an oxide over a defined location of a conductively-doped region of a semiconductor material by exposure of the semiconductor material to deuterium-enriched steam;

(4) forming at least a portion of an isolation region by exposure of a semiconductor material to deuterium-enriched steam; and (5) subjecting a semiconductor assembly to an anneal at a temperature of greater than or equal to about 350° C. while exposing the assembly to a deuterium-enriched ambient; and wherein the isolation region is formed within a trench in a silicon-containing substrate, wherein the exposure to the deuterium-enriched steam of step (4) forms a liner within the trench, and further comprising:

forming a silicon nitride film over the liner and within the trench to narrow the trench; and depositing silicon dioxide within the trench to fill the trench and complete the isolation region.

9. The method of claim 1 wherein the semiconductor material of steps (1), (2), (3) and (4) is monocrystalline silicon.

10. The method of claim 1 wherein the deuterium-enriched steam of at least one of the steps comprises an isotopic abundance of deuterium relative to other hydrogen isotopes of greater than 0.02%.

11. The method of claim 1 wherein the deuterium-enriched steam of at least one of said two more the steps comprises an isotopic abundance of deuterium relative to other hydrogen isotopes of at least about 1%.

12. The method of claim 1 wherein the deuterium-enriched steam of at least one of the steps comprises an isotopic abundance of deuterium relative to other hydrogen isotopes of at least about 10%.

13. The method of claim 1 wherein the deuterium-enriched steam of at least one of the steps comprises an isotopic abundance of deuterium relative to other hydrogen isotopes of at least about 25%.

14. The method of claim 1 wherein the deuterium-enriched steam of at least one of the more steps comprises an isotopic abundance of deuterium relative to other hydrogen isotopes of at least about 50%.

15. The method of claim 1 wherein the deuterium-enriched steam of at least one of the steps comprises an isotopic abundance of deuterium relative to other hydrogen isotopes of at least about 75%.

16. The method of claim 1 wherein the deuterium-enriched steam of at least one of the steps comprises an isotopic abundance of deuterium relative to other hydrogen isotopes of about 100%.

17. The method of claim 1 wherein the deuterium-enriched steam of at least one of the steps is formed in-situ from deuterium-enriched molecular hydrogen and $O_2$ during said at least one of the steps.

18. The method of claim 1 wherein the temperature of the anneal of step (5) is from about 350° C. to about 450° C.

19. A method of forming and passivating a semiconductor construction, comprising:

forming one or more oxides over a semiconductor substrate by exposing semiconductor material of the substrate to deuterium-enriched steam, the semiconductor substrate with said one or more oxides thereover being at least a portion of a semiconductor construction;

forming a hydrogen-enriched silicon nitride layer over the one or more oxide regions; and after forming the hydrogen-enriched silicon nitride layer, subjecting the semiconductor construction to an anneal at a temperature of greater than or equal to about 350° C. while exposing the construction to a deuterium-enriched ambient; deuterium diffusing from the ambient and through the hydrogen-enriched silicon nitride layer during the passivating.

20. The method of claim 19 wherein the temperature of the anneal is from about 350° C. to about 450° C.

21. The method of claim 19 wherein one or both of the deuterium-enriched ambient and the deuterium-enriched steam comprises an isotopic abundance of deuterium relative to other hydrogen isotopes of greater than 0.02%.

22. The method of claim 19 wherein one or both of the deuterium-enriched ambient and the deuterium-enriched steam comprises an isotopic abundance of deuterium relative to other hydrogen isotopes of at least about 1%.

23. The method of claim 19 wherein one or both of the deuterium-enriched ambient and the deuterium-enriched steam comprises an isotopic abundance of deuterium relative to other hydrogen isotopes of at least about 10%.

24. The method of claim 19 wherein one or both of the deuterium-enriched ambient and the deuterium-enriched steam comprises an isotopic abundance of deuterium relative to other hydrogen isotopes of at least about 25%.

25. The method of claim 19 wherein one or both of the deuterium-enriched ambient and the deuterium-enriched steam comprises an isotopic abundance of deuterium relative to other hydrogen isotopes of at least about 50%.

26. The method of claim 19 wherein one or both of the deuterium-enriched ambient and the deuterium-enriched steam comprises an isotopic abundance of deuterium relative to other hydrogen isotopes of at least about 75%.

27. The method of claim 19 wherein one or both of the deuterium-enriched ambient and the deuterium-enriched steam comprises an isotopic abundance of deuterium relative to other hydrogen isotopes of about 100%.

28. The method of claim 19 wherein the deuterium-enriched ambient comprises one or both of $D_2$ and DH.

29. The method of claim 19 wherein the hydrogen of the hydrogen-enriched silicon nitride layer comprises about a natural isotopic abundance of deuterium.

30. The method of claim 19 wherein the hydrogen of the hydrogen-enriched silicon nitride layer comprises a greater concentration of deuterium than the natural isotopic abundance of deuterium.

31. The method of claim 19 wherein the hydrogen of the hydrogen-enriched silicon nitride layer comprises at least a two-fold greater concentration of deuterium than the natural isotopic abundance of deuterium.

32. The method of claim 19 wherein the hydrogen of the hydrogen-enriched silicon nitride layer comprises at least a ten-fold greater concentration of deuterium than the natural isotopic abundance of deuterium.

33. A method of forming and passivating a semiconductor construction, comprising:

forming at least one gate oxide over a semiconductor substrate by exposing semiconductor material of the substrate to deuterium-enriched steam;

forming at least one isolation region by forming a trench in the semiconductor material of the substrate and exposing the semiconductor material within the trench to deuterium-enriched steam to form an oxide liner within the trench, the semiconductor substrate having the at least one gate oxide and at least one isolation region thereover being at least a portion of a semiconductor construction; and subjecting the semiconductor construction to an anneal at a temperature of greater than or equal to about 350° C. while exposing the semiconductor construction to a deuterium-enriched ambient to passivate the construction.

34. The method of claim 33 wherein the temperature of the anneal is from about 350° C. to about 450° C.

35. The method of claim 33 wherein the forming the at least one gate oxide comprises forming a first gate oxide by exposure to deuterium-enriched steam, and subsequently forming a second gate oxide by exposure to deuterium-enriched steam, and wherein the first and second gate oxide differ in thickness relative to one another by at least about 15 Å.

36. The method of claim 33 further comprising:
forming an electrically conductive transistor gate spaced from the semiconductor material of the substrate by one of the at least one gate oxides;
defining a pair of electrically conductive source/drain region locations within the semiconductor material of the substrate and proximate the electrically conductive transistor gate; and
prior to the anneal, thermally oxidizing the semiconductor material of the substrate over the source/drain region locations by exposing the semiconductor material to deuterium-enriched steam.

37. The method of claim 33 further comprising:
forming a silicon nitride film over the oxide liner within the trench to narrow the trench; and
depositing silicon dioxide within the trench to fill the trench and complete the isolation region.

38. The method of claim 33 wherein the deuterium-enriched ambient and steams comprise an isotopic abundance of deuterium relative to other hydrogen isotopes of greater than 0.02%.

39. The method of claim 33 wherein the deuterium-enriched ambient and steams comprise an isotopic abundance of deuterium relative to other hydrogen isotopes of at least about 1%.

40. The method of claim 33 wherein the deuterium-enriched ambient and steams comprise an isotopic abundance of deuterium relative to other hydrogen isotopes of at least about 10%.

41. The method of claim 33 wherein the deuterium-enriched ambient and steams comprise an isotopic abundance of deuterium relative to other hydrogen isotopes of at least about 25%.

42. The method of claim 33 wherein the deuterium-enriched ambient and steams comprise an isotopic abundance of deuterium relative to other hydrogen isotopes of at least about 50%.

43. The method of claim 33 wherein the deuterium-enriched ambient and steams comprise an isotopic abundance of deuterium relative to other hydrogen isotopes of at least about 75%.

44. The method of claim 33 wherein the deuterium-enriched ambient and steams comprise an isotopic abundance of deuterium relative to other hydrogen isotopes of about 100%.

45. The method of claim 33 further comprising:
forming the semiconductor construction to including a hydrogen-enriched silicon nitride layer over the at least one gate oxide and over the at least one isolation region; and
diffusing deuterium from the ambient through the hydrogen-enriched silicon nitride layer during the passivating.

46. The method of claim 45 wherein the hydrogen of the hydrogen-enriched silicon nitride layer comprises about a natural isotopic abundance of deuterium.

47. The method of claim 45 wherein the hydrogen of the hydrogen-enriched silicon nitride layer comprises a greater concentration of deuterium than the natural isotopic abundance of deuterium.

48. The method of claim 45 wherein the hydrogen of the hydrogen-enriched silicon nitride layer comprises at least a two-fold greater concentration of deuterium than the natural isotopic abundance of deuterium.

49. The method of claim 45 wherein the hydrogen of the hydrogen-enriched silicon nitride layer comprises at least a ten-fold greater concentration of deuterium than the natural isotopic abundance of deuterium.

* * * * *

UNITED STATES PATENT AND TRADEMARK OFFICE
CERTIFICATE OF CORRECTION

| | | |
|---|---|---|
| PATENT NO. | : 7,189,662 B2 | Page 1 of 1 |
| APPLICATION NO. | : 10/925793 | |
| DATED | : March 13, 2007 | |
| INVENTOR(S) | : Parekh et al. | |

It is certified that error appears in the above-identified patent and that said Letters Patent is hereby corrected as shown below:

In column 12, line 6, in Claim 1, after "comprising" delete "of".

In column 12, line 15, in Claim 1, delete "15A" and insert -- 15Å --, therefor.

In column 12, line 62, in Claim 8, delete "15 A" and insert -- 15Å --, therefor.

In column 13, line 4, in Claim 8, delete "subiecting" and insert -- subjecting --, therefor.

In column 13, line 24, in Claim 11, after "one of" delete "said two more".

In column 13, line 36, in Claim 14, after "of the" delete "more".

Signed and Sealed this

Eighteenth Day of March, 2008

JON W. DUDAS
*Director of the United States Patent and Trademark Office*